United States Patent
Tan et al.

(10) Patent No.: US 8,426,254 B2
(45) Date of Patent: Apr. 23, 2013

(54) LEADLESS SEMICONDUCTOR PACKAGE WITH ROUTABLE LEADS, AND METHOD OF MANUFACTURE

(75) Inventors: Jerry Tan, Calamba (PH); William Cabreros, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 47 days.

(21) Appl. No.: 12/982,841

(22) Filed: Dec. 30, 2010

(65) Prior Publication Data

US 2012/0168921 A1    Jul. 5, 2012

(51) Int. Cl.
*H01L 21/00* (2006.01)

(52) U.S. Cl.
USPC .............................. 438/123; 257/666; 438/124

(58) Field of Classification Search .................. 257/666, 257/669, 670, 676; 438/111, 112, 120, 123
See application file for complete search history.

(56) References Cited

U.S. PATENT DOCUMENTS

| | | | |
|---|---|---|---|
| 2004/0063252 A1* | 4/2004 | Takahashi | 438/123 |
| 2008/0211068 A1* | 9/2008 | Chen et al. | 257/666 |
| 2010/0171201 A1* | 7/2010 | Wyant et al. | 257/676 |
| 2010/0258920 A1* | 10/2010 | Chien et al. | 257/666 |
| 2012/0025357 A1* | 2/2012 | Li | 257/666 |

* cited by examiner

*Primary Examiner* — Kimberly Rizkallah
*Assistant Examiner* — Errol Fernandes
(74) *Attorney, Agent, or Firm* — Seed IP Law Group PLLC

(57) ABSTRACT

A leadless semiconductor package includes a package body on a leadframe that includes a die paddle and a plurality of high-aspect-ratio leads, each coupled at a first end to a contact pad of the package, and at a second end to a semiconductor die mounted to the die paddle. During manufacture of the package, molding compound is deposited over a face of the leadframe on which the die paddle and leads are positioned. After the molding compound is cured, a back side of the leadframe is etched to isolate the die paddle and leads, and to thin a portion of each of the leads. Back surfaces of the leads remain exposed at a back face of the body. The thinned portions of the leads are covered with a dielectric. During manufacture of the leadframe, a parent substrate is etched to define the die paddle and a plurality of leads on one side of the substrate and a plurality of cavities on the opposite face.

13 Claims, 9 Drawing Sheets

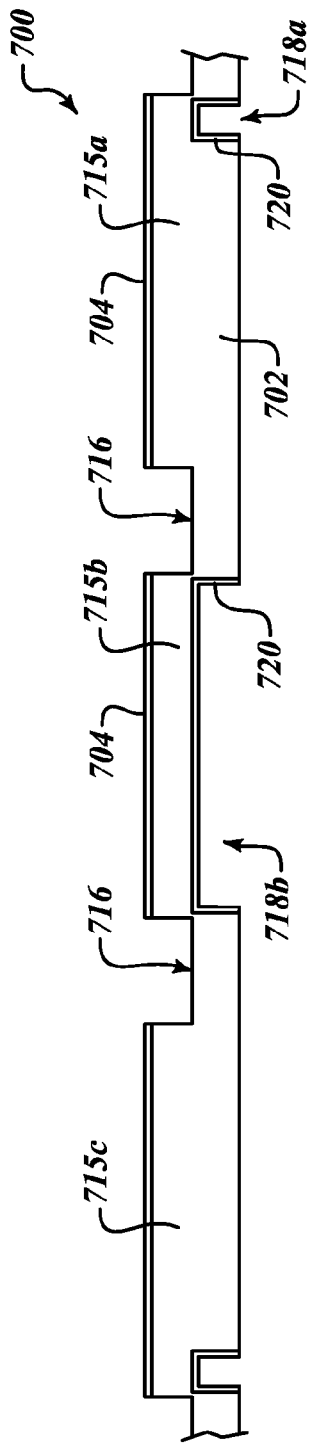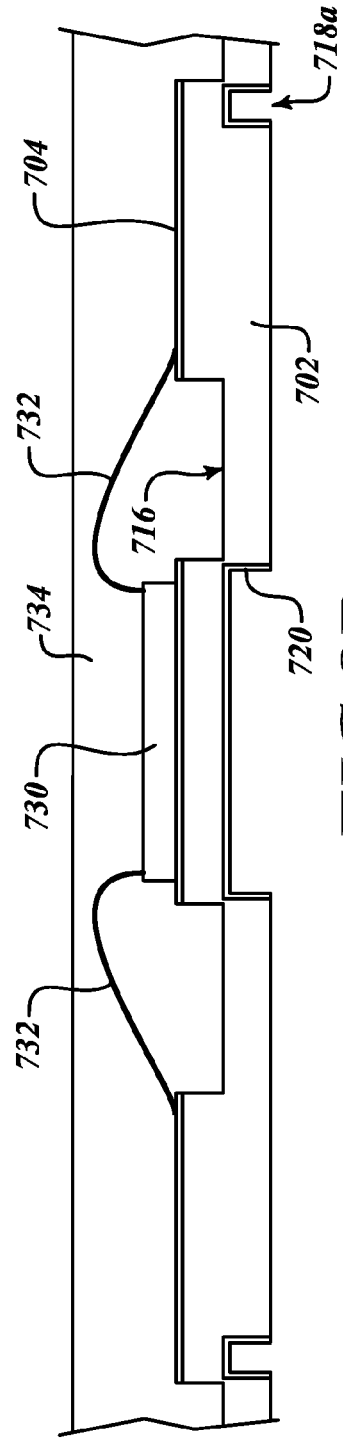

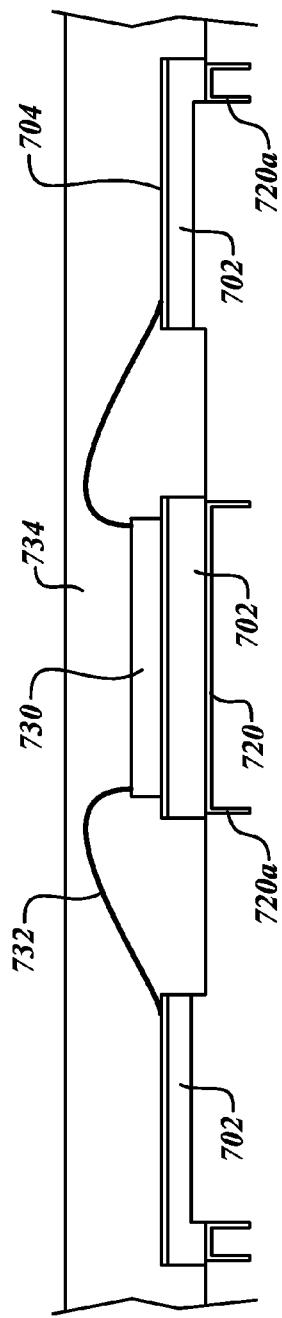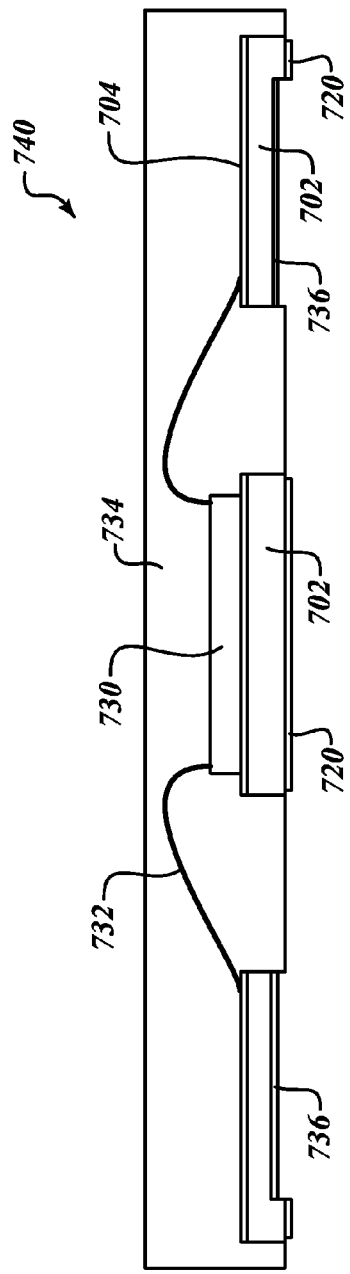

LEADLESS SEMICONDUCTOR PACKAGE WITH ROUTABLE LEADS, AND METHOD OF MANUFACTURE

BACKGROUND OF THE INVENTION

1. Technical Field

The present disclosure relates to semiconductor packaging, and in particular to leadframe-based packages, to leadframes employed in such packages, and most particularly to flat, leadless type packages and leadframes, such as, e.g., QFN packages.

2. Description of the Related Art

While significant advances have been made in semiconductor packaging, including the development of a very large number of packaging types, the majority of semiconductor devices still employ leadframe based packages. This is due to a number of reasons. In particular, leadframe packages are relatively inexpensive to produce, are well known and understood, the tooling is already in hand or readily available, etc. Additionally, leadframe packages have some advantages over many other packages, including having better thermal transmission characteristics, and more being more robust. As industry demand moves toward smaller packages and higher contact density, leadframe technology continues to evolve, so that even within the general category of leadframe packages, there are many different types. One of the most popular configurations is the flat no-lead-type package, including, for example, the quad flat no-lead (QFN) package. No-lead packages are popular because contact surfaces for I/O are on the back side of the package, so that when in use, they are between the package and the circuit board. This means that the board designer can move the PCB's corresponding contacts into the footprint of the package, which reduces the total real estate occupied by a QFN package, as compared to an otherwise identical package that is configured for surface mount or pin mount.

Additionally, as maximum circuit density in integrated circuits increases, back-end designers are under pressure to keep pace with the demand for higher density circuits by providing packaging that can enable larger numbers of contacts for a given package size. There are a number of physical constraints that interfere with progress in this area, some of which will be discussed below.

FIG. 1A is a plan view of a QFN package 100 according to known art, with the package body 101 rendered transparent to show the configuration of the leadframe and wirebonding. A side view of the device is shown in FIG. 1B. A plurality of bond pads are distributed around a perimeter of the package, arranged in a first row of bond pads 102 and a second row of pads 103 arranged concentrically. Leads 107, which couple bond pads 103 of the second row to a support frame that originally supported them, thread between pairs of the pads 102 of the first row of bond pads to contact the second row of pads. A die paddle 104 is positioned in the center, and a semiconductor die 105 is positioned on the die paddle. Bond wires 109 extend from contact pads 110 on the semiconductor die 105 to bond pads 102 of the first row, while bond wires 108 extend from contact pads 110 on the semiconductor die 105 to bond pads 103 of the second row of pads. There are two conflicting problems that affect the reliability of this device. First, it can be seen that the wires are long, and in many places they are positioned very close to each other as they arc across from the die to respective bond pads. This arrangement is likely prone to shorting between the wires during the encapsulation process because of their excessive length and close proximity. this problem could be reduced somewhat if the bond pads were moved closer to the center of the device so the wires could be shortened, but this raises a different problem.

Referring to FIG. 1B, it can be seen that the leads 107 are thinned between the pads 103 and the outer edge of the device 100. This is done to prevent the leads 107 from unintentionally contacting contact pads on a circuit board that are intended for contact by pads of the first row. As the bond pads are moved toward the center of the device, the leads 107 must be made longer to reach the more distant leads. Given their small dimensions, the leads 107 are not capable of supporting bond pads at any significant distance. On the other hand, they cannot be made either wider or thicker without risking contact with other leads or with underlying circuit board pads.

FIGS. 2A and 2B show another QFN device 200 that has contact pads 202 distributed in a single row about the perimeter, with long leads 203 extending from the contact pads 202 toward the center of the device. This enables the use of shorter bond wires 204 extending from contact pads 207 of the semiconductor die 205, but requires extremely long and thin cantilevered leads 203, as shown in FIG. 2B. This arrangement is again unreliable, and prone to shorting during handling steps prior to encapsulation.

FIGS. 3A and 3B show a known QFN device 300 that includes fingers 304 configured to receive solder bumps 305 of a flip chip 302, placing them in electrical contact with contact pads 303 at the perimeter of the device. As shown in FIG. 3B, the fingers 304 are thinned to raise the bottom surfaces from the bottom of the device, so that the fingers are cantilevered in toward the center of the package. A problem that arises here is that, when the flip chip die 302 is positioned on the fingers 304 by a place-and-pick machine, they have a tendency to flex slightly, then spring back when the machine releases, causing the die 302 to bounce, sometimes bouncing enough to shift the die out of alignment with the fingers 30

BRIEF SUMMARY

A leadless semiconductor package includes a package body on a leadframe that includes a die paddle and a plurality of high-aspect-ratio leads, each coupled at a first end to a contact pad of the package, and at a second end to a semiconductor die mounted to the die paddle. During manufacture of the package, molding compound is deposited over a face of the leadframe on which the die paddle and leads are positioned. After the molding compound is cured, a back side of the leadframe is etched to isolate the die paddle and leads, and to thin a portion of each of the leads. Back surfaces of the leads remain exposed at a back face of the body. The thinned portions of the leads are covered with a dielectric while the remaining portions serve as contact surfaces for the package. During manufacture of the leadframe, a parent substrate is etched to define the die paddle and a plurality of leads on one side of the substrate and a plurality of cavities on the opposite face. Each of the plurality of high-aspect-ratio leads is coupled to a surface of the leadframe along its entire length until after a molding compound is deposited and cured to forma body of the package.

BRIEF DESCRIPTION OF THE SEVERAL VIEWS OF THE DRAWINGS

FIGS. 8A-8D are cross-sectional diagrams showing respective stages of the assembly of semiconductor packages according to one embodiment, using the leadframe described with reference to FIGS. 7A-7C.

DETAILED DESCRIPTION

The problems encountered by the prior art devices described above are eof concern primarily because of the increase in density of contacts, and the need to span greater distances laterally between contact pads of a semiconductor substrate and the corresponding contact pad of the package. Bond wires cannot safely exceed some maximum length, so it is necessary to move the bond pads to which the wires are coupled closer to the center of the package. This in turn requires that leadframe leads be increased in length. At the same time, as the ends of the leads are brought closer to the center, they must be made narrower to fit in the smaller area. Finally, it must be born in mind that bottom surfaces of elements of the leadframe will be exposed at the bottom of the semiconductor package after encapsulation. Where a lead extends across the back side of a package, it creates the potential for short circuits between elements of a circuit board. Because flat "no-lead" packages are mounted in face-to-face contact with a circuit board, even the thickness of a layer of solder resist to prevent shorts can interfere with the package's ability to reliably couple to the board. Thus, where long leads are employed, they must be thinned along the bottom to prevent undesirable contact with the circuit board.

The length of a leadframe lead, relative to its combined width and thickness can be referred to as its aspect ratio. As the aspect ratio increases, the rigidity of the lead decreases, usually at the same time that spacing becomes more critical, and small changes in position more likely to result in contact with another lead. Of course, the problems discussed above are only important at one moment in time. During the period in which a semiconductor die is coupled to a leadframe and wirebonded to bond pads of the leads, the device is unpowered, so momentary contacts of the leads or bond wires have no effect. However, when molding compound is deposited over the assembly of elements, and cured by heat and pressure, if wires or leads move or flex as the viscous material flows over, they can easily be brought into contact by action of the molding compound, then held in contact while the compound cures. This, then is the critical period. If movement can be prevented during the encapsulation process, the elements of the device will thereafter be rigidly supported by the hardened compound.

According to various embodiments, structures and processes are provided that permit leads having very high aspect ratios, relative to those of the prior art, while ensuring that no movement will occur before or during encapsulation.

Figure 1A:
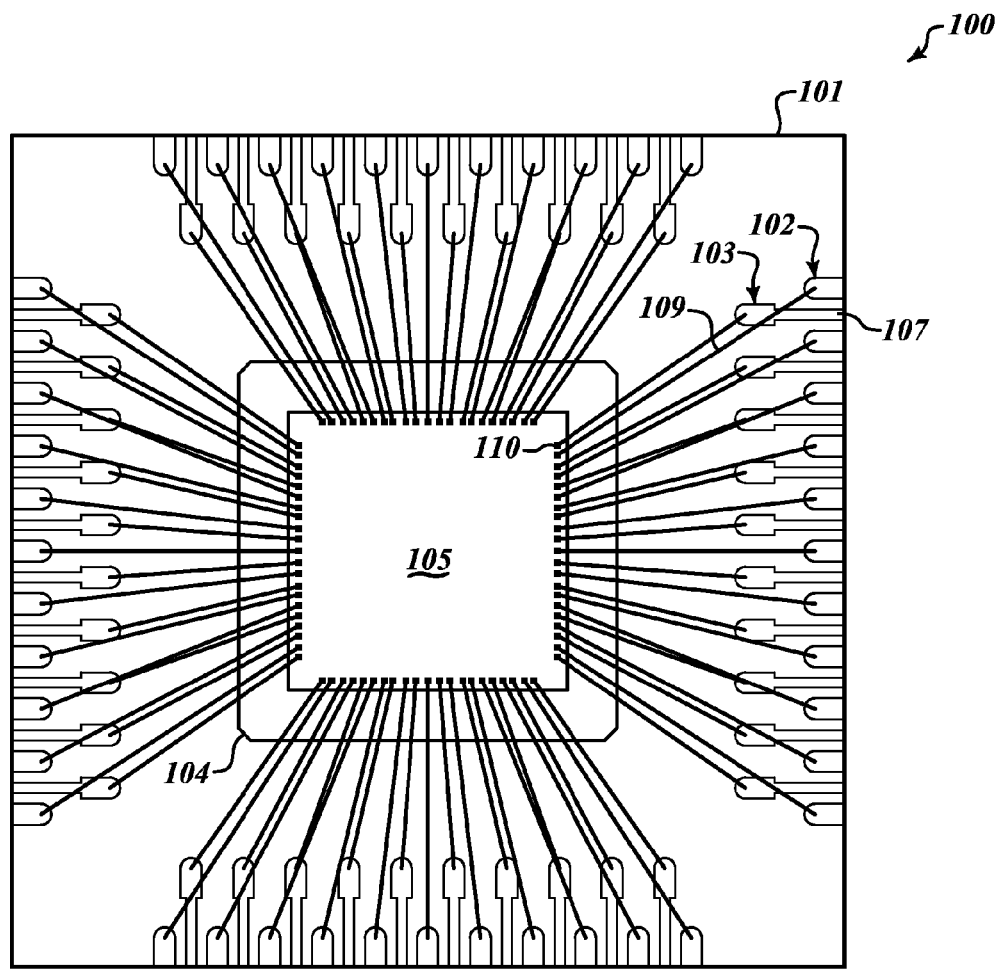
FIGS. 1A and 2A are top plan views of respective QFN packages according to known art.
Figure 1B:
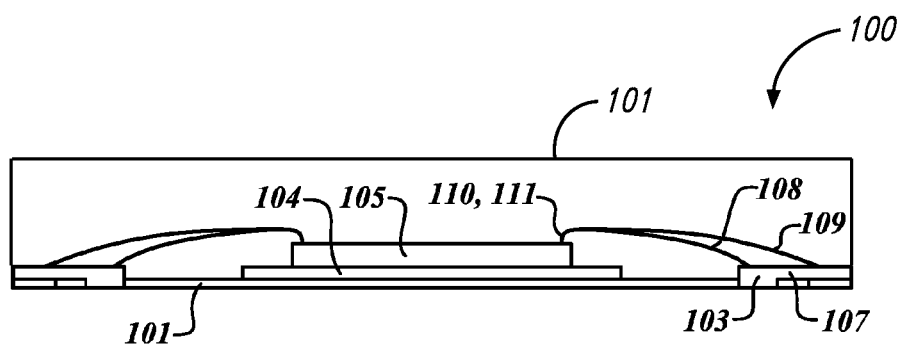
FIGS. 1B, 2B, and 3B are side views of the QFN devices, respectively, of FIGS. 1A, 2A, and 3A.
Figure 2A:
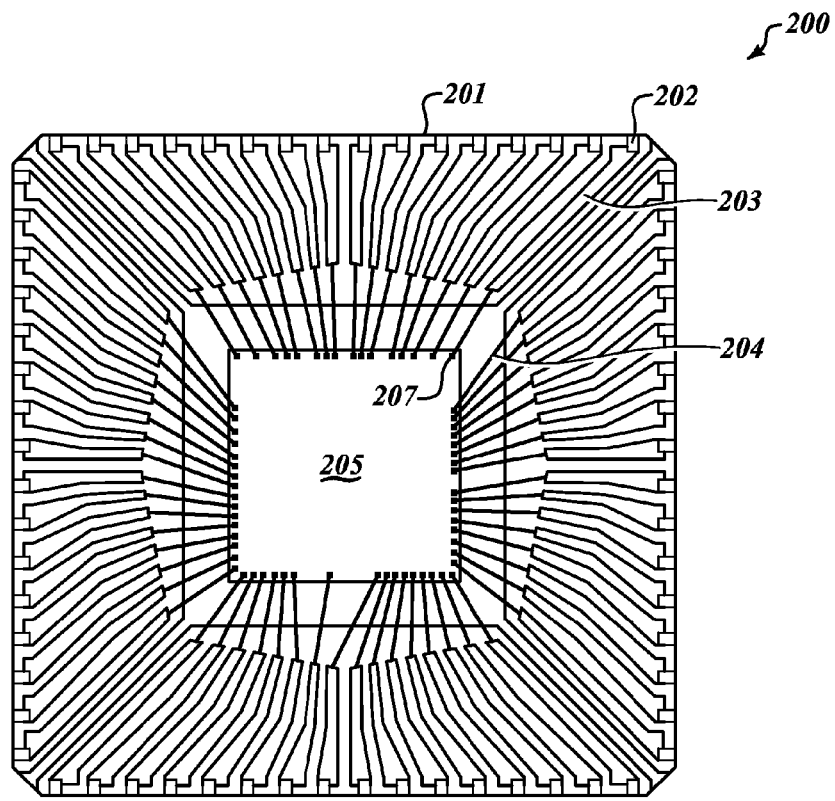
Figure 2B:
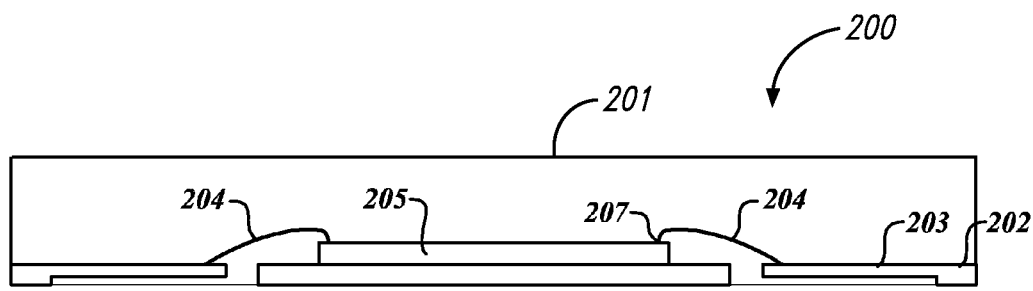
Figure 3A:
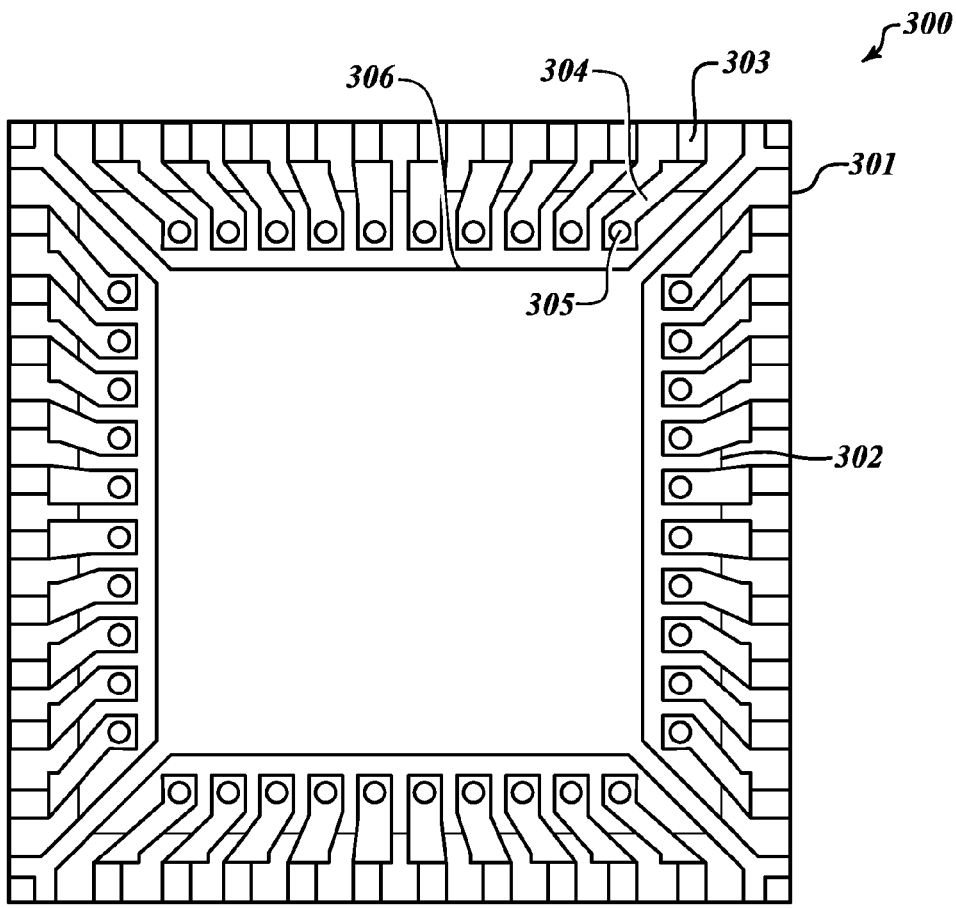
FIG. 3A is a bottom plan view of a QFN package according to known art.
Figure 3B:
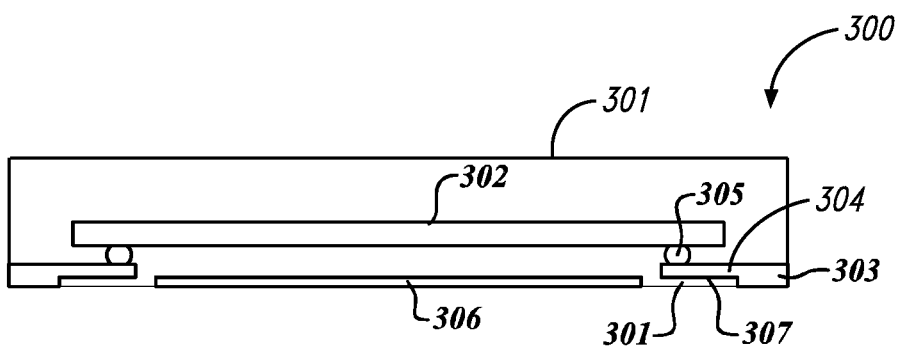
Figure 4:
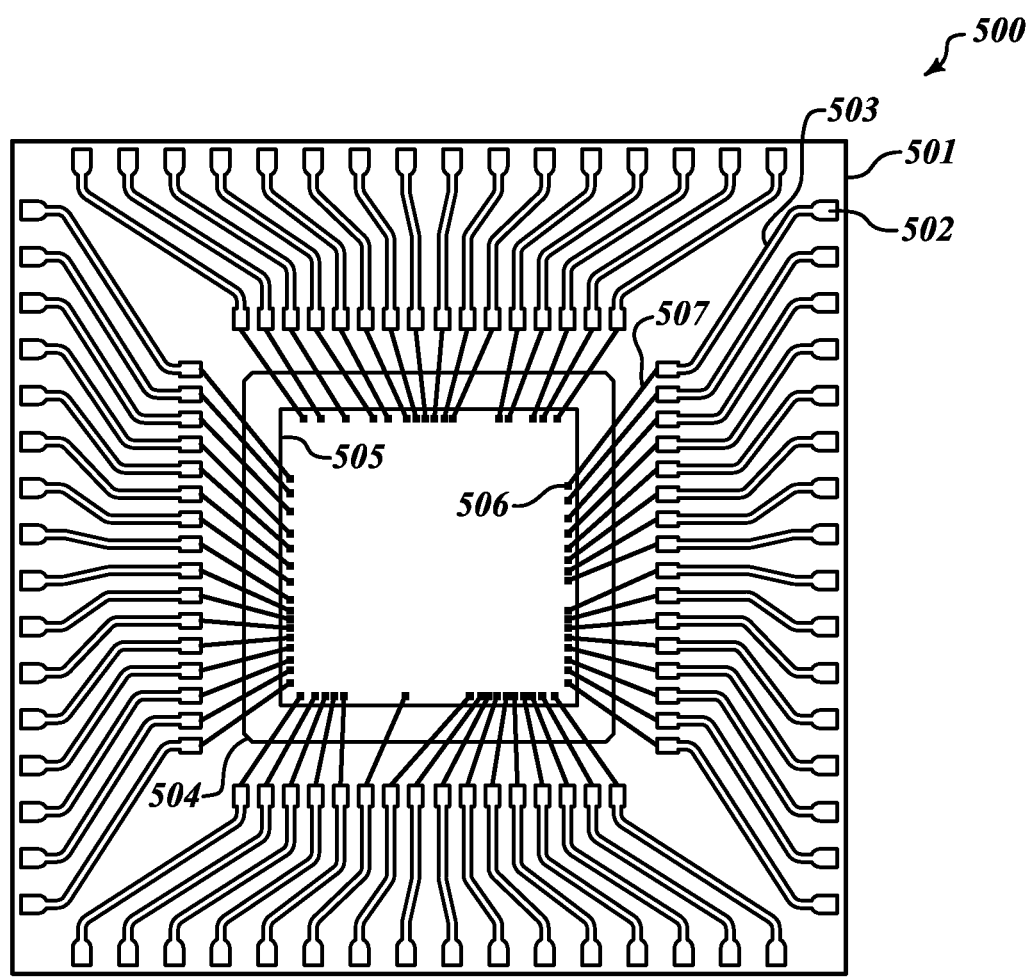
FIG. 4 is a plan view of a QFN package according to one embodiment.

FIG. 4 is a plan view of a QFN package 500 according to one embodiment, having a package body 501 with a number of leads 503 extending from contact pads 502 near a perimeter of the device to bond pads 508. Bond wires 507 place the respective bond pads 508 in electrical contact with contact pads 506 of a semiconductor die 505 that is mounted to a die paddle 504 of the device. Because the leads extend very near to the semiconductor die, the bond wires 507 are kept short, and generally safe from undesired contacts. The structure by which the high aspect ratio leads 503 are held stationary will be described in detail later.

Figure 5:
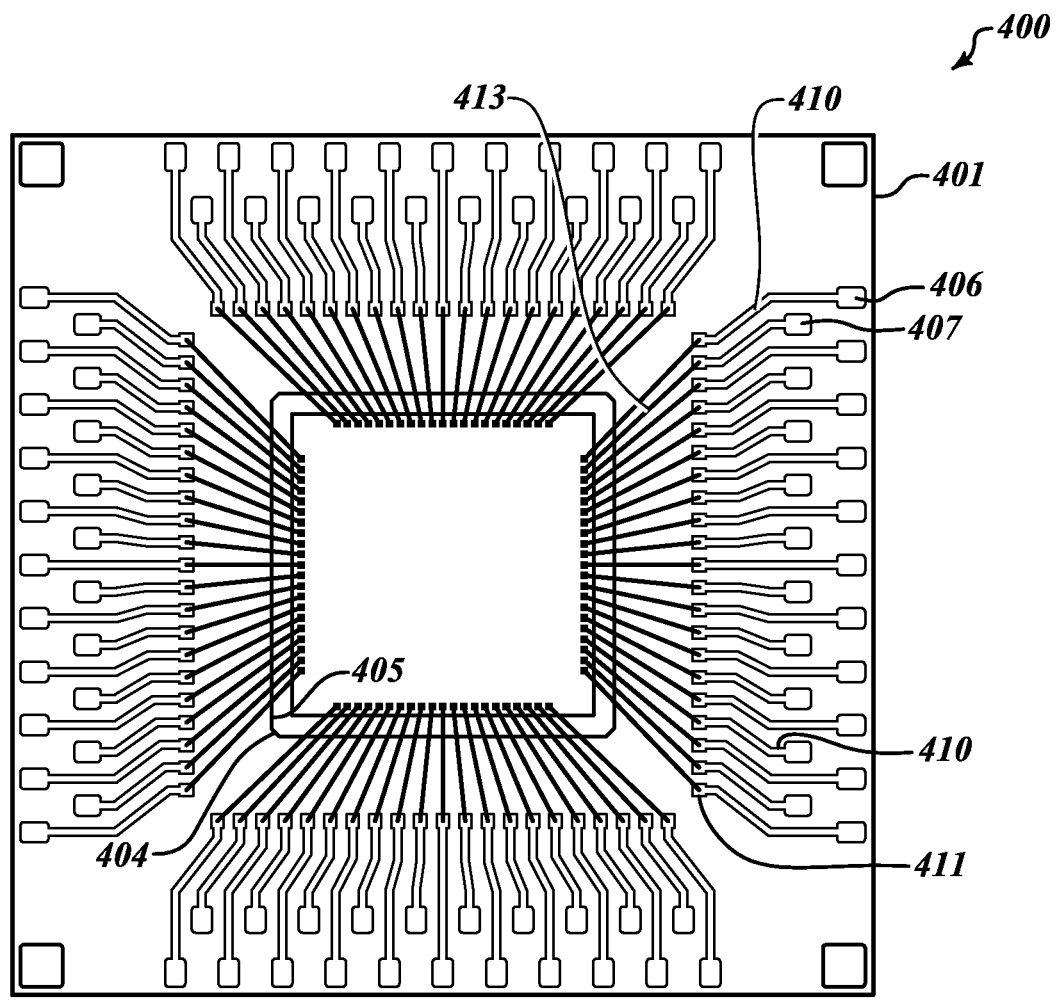
FIG. 5 is a plan view of a QFN package according to another embodiment.

FIG. 5 is a plan view of a QFN package 400 according to another embodiment. The package 400 provides a first row of contact pads 406 and a second row of pads 407, each of which is coupled to a respective lead 410, and thence to a respective bond pad 411. As with the configuration described with reference to FIG. 4, the leads 410 are sufficiently long that the bond wires 413 can be well below a maximum safe length.

Figure 6:
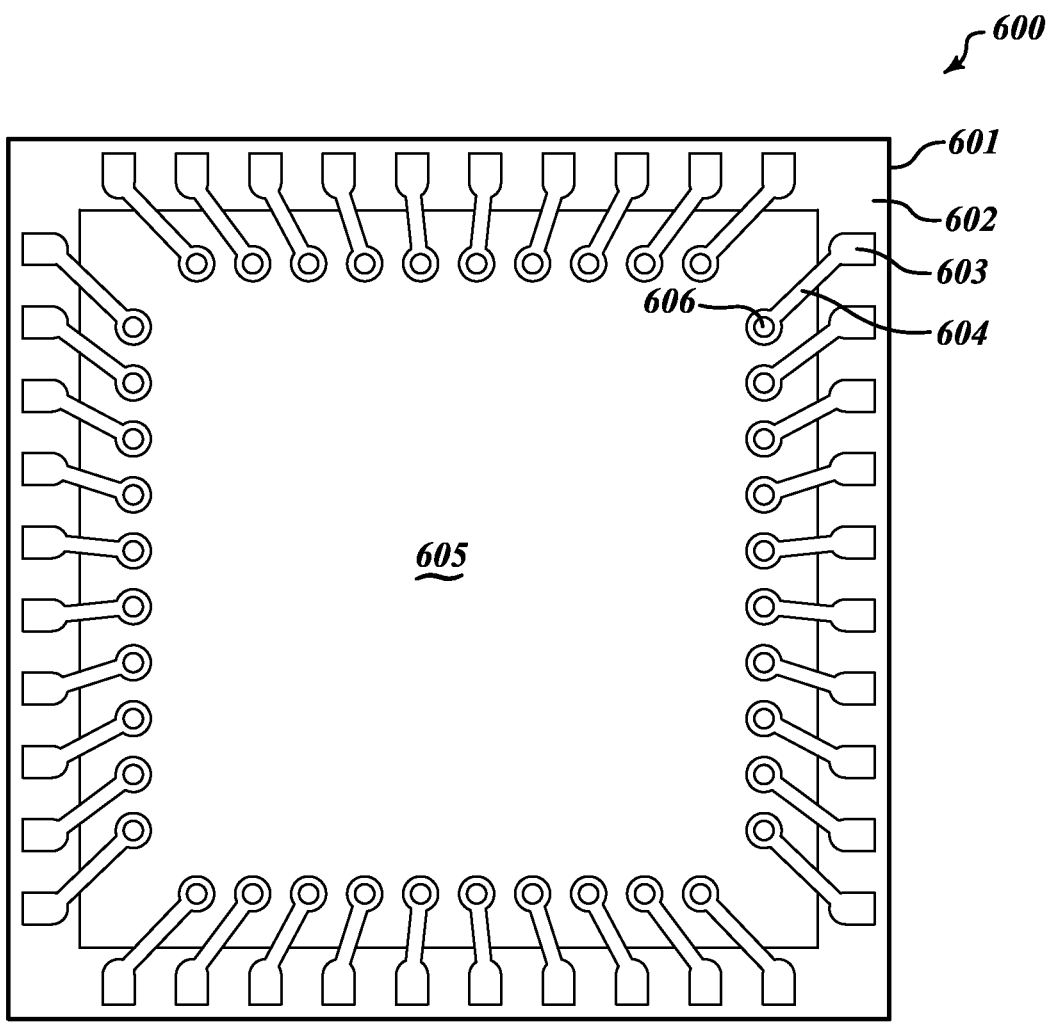
FIG. 6 is a bottom plan view of a QFN semiconductor package according to an embodiment.

FIG. 6 is a bottom plan view of a semiconductor package 600 that includes a flip-chip 605, according to an embodiment. Solder balls 606 are positioned on respective leadframe fingers 604, which place the solderballs in electrical contact with contact pads 603 of the package 600. Again, a structure is provided that prevents flexion of the fingers 604 during assembly, so the flip chip will not bounce.

A process for manufacturing a leadframe 700, according to one embodiment, will be described with reference to FIGS. 7A-7C. Thereafter, a process for forming a semiconductor package on the leadframe, according to an embodiment, will be described with reference to FIGS. 8A-8D.

Figure 7A:
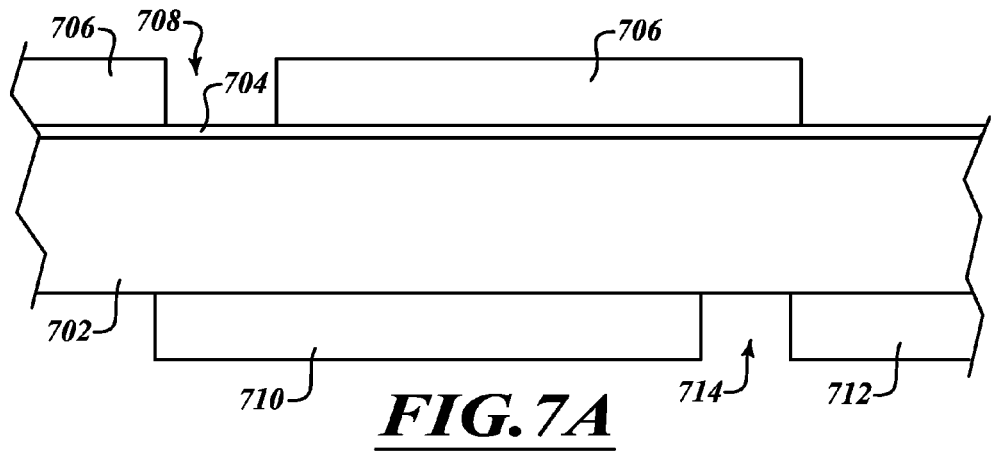
FIGS. 7A-7C are cross-sectional diagrams of a portion of a leadframe at respective stages of manufacture, according to one embodiment.
Figure 7B:
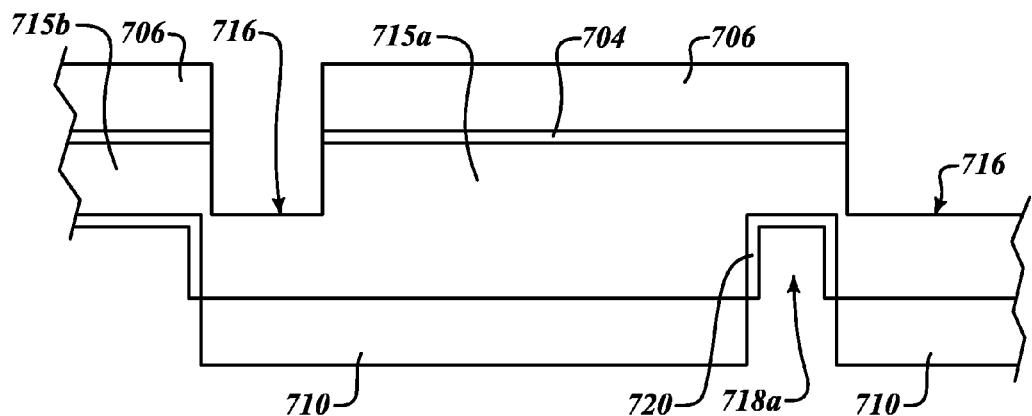
Figure 7C:
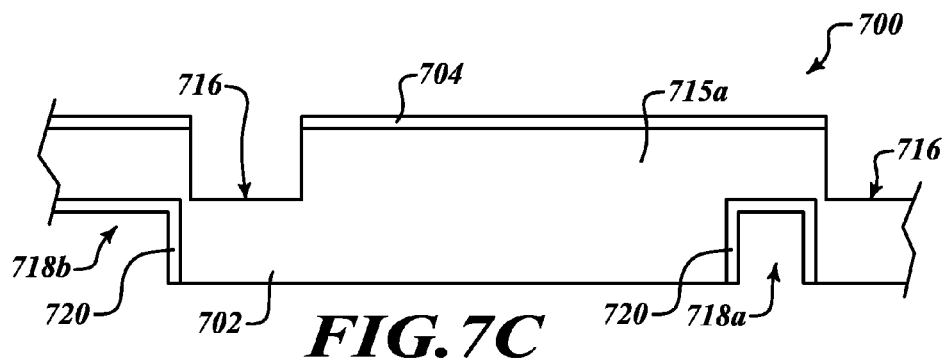

FIGS. 7A-7C are cross-sectional diagrams of a portion of a leadframe 700 at respective stages of manufacture, according to one embodiment. The process begins with a substrate 702, which is part of a strip 701 of copper having a thickness $T_1$ of about 100 μm. According to an alternate embodiment, the strip 701 has a thickness $T_1$ of about 50 μm. After cleaning to remove oxides that normally form on copper, a layer of metal 704 is plated onto a first side of the substrate—hereafter the front side. A layer of etch resist 706 is then deposited over the metal layer 704 and patterned to protect the portions of the parent strip that will become lands on the front side of the leadframe. A second layer of etch resist 710 is deposited on the back side of the substrate 702 and patterned to expose areas of the back side where cavities are to be formed. This stage in the process is shown in FIG. 7A.

As shown in FIG. 7B, the front side of the substrate 702 is etched to remove the plated metal 704 that is not protected by the etch resist layer 706, then both sides are etched to remove a selected thickness of the substrate 702 to form cavities 718 on the back side, and to define lands 715 and a lower face 716 on the front side. In the embodiment shown in FIG. 7B, each side is etched to a depth of about half the total thickness of the strip 701. The shape and position of the cavity 718a on the back side are selected so as to be aligned with one end of the land 718a on the front side of the strip Following the etch step, the back side of the substrate 702 is plated. In an electroplating operation, the material to be plated must be electrically conductive. Because the back side of the substrate is entirely covered by a layer of non-conductive etch resist except over the newly formed cavities 718, only the inner walls of the cavities are plated in the operation. If necessary, the front side of the substrate 702 can be temporarily covered to prevent plating on that side. Finally, the etch resist layers on both sides of the substrate 702 are removed from the strip, leaving the completed leadframe 700 as shown in FIG. 7C.

FIGS. 8A-8D are cross-sectional diagrams showing respective stages of the assembly of semiconductor packages according to one embodiment, using the leadframe 700 described with reference to FIGS. 7A-7C. In particular, FIG. 8A shows a larger portion of the leadframe 700 shown in FIG. 7C.

As shown in FIG. 8B, a semiconductor die 730 is adhered to a die paddle 715b of the leadframe 700, and contact pads of the die are wirebonded to bondpads of lands 715a and 715c. These processes are very well known and understood in the art, and so will not be described in detail. The cavity 718b positioned on the back side of the substrate 702 directly opposite the die paddle 715b is substantially the same size as the die paddle.

A layer of molding compound 734 is then deposited over the front side of the leadframe 700 and cured, encapsulating the semiconductor die 730 and bond wires 732. Once the molding compound is cured, the back side of the leadframe 700 is etched to selectively remove portions thereof. The etch chemistry is formulated to selectively dissolve the copper of the substrate 702, but not the metal plated into the cavities 718. When applied from the back side of the substrate, the etch removes the material of the substrate that lies between the cavities, until the process reaches the lower face 716 of the front side. Bearing in mind that molding compound will have been deposited and cured on the front side, and will be impervious to the etch, when the etch reaches the lower face, it will substantially stop in that location. However, portions of the lands 715a and 715c that are not protected by the plated metal 720 are allowed to continue etching for some period after the etch reaches the molding compound. Accordingly, these portions are recessed, relative to other portions of the back side of the substrate. With the etching of the back side of the leadframe 700, the elements of the leadframe are now electrically isolated from each other except where they are coupled by the wirebonds.

Once the etching process is complete, the portions 720a of the plating that were on the sidewalls of the cavities will be unsupported, as shown in FIG. 8C. Bearing in mind that in practice the layers of plated metal are only microns thick, the unsupported portions are little more than fragile burrs surrounding the contact surfaces on the back side of the package. The greatest danger is that pieces may break away and create short circuits or otherwise interfere with proper operation of the device. Accordingly, the assembly is pressure washed by a jet of high-pressure water, which quickly breaks off and removes all of the loose material, leaving the plated surfaces 720 on the back side of the package.

Turning to FIG. 8D, a layer of solder resist is deposited in the recessed portion of the lands 715a and 715c, and the completed semiconductor package is cut apart into individual packages 740, which are tested and marked.

The lands 715a and 715c shown in FIG. 8D are two of a plurality of high-aspect-ratio leads of the device that electrically couple contact pads of the semiconductor die 730 to contact pads of a circuit board, via plated surfaces 720 positioned on the back sides of the respective lands. Referring again to FIG. 8b, it can be seen that at the time the bond wires are attached, and while the molding compound is being deposited, the lands 15a and 15c are fully supported by the underlying substrate 702, and therefore cannot move from their positions. The etch process that frees the leads from the substrate is not performed until after the molding compound has been deposited and cured. Thus, at no time during the assembly of the package are the leads able to change position, so there is never any possibility that two adjacent leads might contact each other during the process, as occurs with the prior art devices described above. All of the lead of the package 740 are similarly supported. A similar process is used to form the fingers 603 of the device 600 of FIG. 6. In particular, a lead frame is provided on which the fingers are formed on a front surface and supported until the flip-chip is positioned and attached, and molding compound is deposited and cured.

While a particular series of process steps has been disclosed for manufacturing a leadframe, there are many different known processes related to patterning and etching, many of which are interchangeable and can be selected, often merely on the basis of preference. Thus, an endless variety of different ways can be devised for producing, for example, the leadframe of FIG. 8, based on, for example, different orders of operation, different masking schemes, 1 selection of resist and etch chemistries, etc. Accordingly, the claims are not limited to any particular process or steps of a process except to the extent that the process or steps are explicitly recited, and then only in the claims in which they are recited, and claims that depend therefrom.

Additionally, while the preferred method of manufacture is by chemical machining, the substrate of a leadframe can also be stamped to form lands on the front face and corresponding cavities on the back face. The parent sheet is plated on both faces prior to being stamped, and the back side is also coated with an etch resist. The back side is subjected to a brief abrasion after stamping, which removes the plating and resist on the back surface, without removing them from the cavities. After the molding compound is deposited and cured, and the back of the leadframe is etched, the process will proceed as described above, except that the plating on the front face will remain. It is then necessary to perform another etch to remove the plating, while the plating in the cavities will be largely protected by the etch resist remaining in the cavities, although the burrs extending around the sidewalls of the cavities will be removed as well, eliminating the need for the pressure washing step. Following the etch process, the etch resist is removed using the appropriate solvents.

As used in the specification and claims, the terms front face or front side are used to refer to the side of a leadframe on which a semiconductor device is mounted. Conversely, back side or back face are used to refer to the side or face opposite the front side. The term land is used to refer to the features of a leadframe that extend above the surrounding surface on the front face, and the term lower face is used to refer to a part of the front face of a lead frame that extends around the lands but lies closer to the back face.

The term lateral is used to refer to directions or dimensions extending in a plane that lies substantially parallel to the front and back faces of a leadframe.

The term coupled, as used in the claims, includes within its scope indirect coupling, such as when two elements are coupled with one or more intervening elements even where no intervening elements are recited. For example, where a claim recites a fluid output of a first heat exchanger coupled to a fluid input of a second heat exchanger, this language also reads on embodiments in which fluid passes from a first heat exchanger through a turbine before entering a second heat exchanger.

The term over is used in the specification and claims to refer to the relative positions of two or more elements with respect to a third element, although the third element may be implied by the context. The term on is used to refer to a physical relationship between two elements. Neither term should be construed as requiring direct physical contact between the elements, nor should they be construed as indicating any particular orientation, either absolute, or with respect to the third element. So, for example, if a claim recites a second layer positioned over a first layer on a substrate, this phrase indicates that the second layer is coupled to the substrate and that the first layer is between the second layer and the substrate. It does not indicate that the layers are necessarily in direct physical contact with each other or with the substrate, but may instead have one or more intervening layers or structures. It also does not indicate that the substrate is oriented in a manner that places the second layer physically above the first layer, nor that, for example, the layers are positioned over a front face of the substrate, as that term is used herein.

In describing the embodiments illustrated in the drawings, directional references, such as right, left, top, bottom, etc., are used to refer to elements or movements as they are shown in the figures. Such terms are used to simplify the description and are not to be construed as limiting the claims in any way.

The unit symbol "μm" is used herein to refer to a value in microns. One micron is equal to $1 \times 10^{-6}$ meters.

Ordinal numbers, e.g., first, second, third, etc., are used according to conventional practice, i.e., for the purpose of clearly distinguishing between claimed elements or features thereof. The use of such numbers does not suggest any other relationship, e.g., order of operation or relative position of such elements, nor does it exclude the possible combination of the listed elements into a single, multiple-function, structure or housing. Furthermore, ordinal numbers used in the claims have no specific correspondence to those used in the specification to refer to elements of disclosed embodiments on which those claims read.

Where a claim limitation recites a structure as an object of the limitation, that structure itself is not an element of the claim, but is a modifier of the subject. For example, in a limitation that recites "a leadframe having a die paddle configured to receive a semiconductor die," the semiconductor die is not an element of the claim, but instead serves to define the scope of the term die paddle. Additionally, subsequent limitations in the same claim or dependent claims that recite or characterize additional elements relative to the semiconductor die do not render the die an element of that claim.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The U.S. patent application Ser. No. 12/982,743, filed concurrently herewith and by the same inventors, is directed to subject matter that is related to or has some technical overlap with the subject matter of the present disclosure, and is incorporated herein in its entirety.

Elements of the various embodiments described above can be combined, and further modifications can be made, to provide further embodiments without deviating from the spirit and scope of the invention. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, but should be construed to include all possible embodiments along with the full scope of equivalents to which such claims are entitled. Accordingly, the claims are not limited by the disclosure.

The invention claimed is:

1. A method, comprising:
    affixing a semiconductor die to a leadframe of a first conductive material, the leadframe including a plurality of cavities, and a second conductive material being located on side surfaces and a bottom surface of each of the cavities;
    placing contact pads of the die in electrical contact with first ends of corresponding leads of the leadframe;
    depositing a molding compound over the semiconductor die on the leadframe;
    curing the molding compound on the leadframe;
    exposing portions of a surface of the cured molding compound and exposing the side surfaces of the second conductive material of the cavities by removing corresponding portions of the leadframe, while leaving portions of the leadframe embedded in the molding compound; and
    removing the exposed side surfaces of the second conductive material of the cavities.

2. The method of claim 1 wherein the removing comprises etching a second surface of the leadframe, opposite the first surface while protecting the distal end of each of the leads from an etch process, etching the first portion of each of the leads.

3. The method of claim 1 wherein removing the exposed side surfaces of the second conductive material of the cavities comprises removing the exposed side surfaces of the second conductive material of the cavities by a pressure wash process.

4. The method of claim 1 wherein removing the exposed side surfaces of the second conductive material of the cavities comprises removing the exposed side surfaces of the second conductive material of the cavities to form an outer surface of the lead.

5. The method of claim 1 wherein the first conductive material is copper.

6. A method, comprising:
    affixing a semiconductor die to a first surface of a substrate of a first conductive material, the substrate having a second surface opposite the first surface, the second surface including at least one cavity, a second conductive material on side surfaces and a bottom surface of the at least one cavity;
    wirebonding contact pads of the semiconductor die to the first surface of the substrate;
    after the wirebonding, forming and electrically isolating a plurality of leads from a die paddle of the substrate and exposing the side surfaces of the second conductive material of the at least one cavity by removing portions of the substrate, while leaving the semiconductor die affixed to the die paddle, and while leaving each of the plurality of leads coupled to a respective contact pad of the semiconductor die by a respective wirebonding wire; and
    removing the exposed side surfaces of the second conductive material.

7. The method of claim 6, comprising, before the affixing, forming the metallic substrate such that selected portions of the first surface of the substrate are raised relative to surrounding portions, thereby defining the die paddle and the leads in the metallic substrate.

8. The method of claim 7 wherein the forming the metallic substrate comprises forming the metallic substrate in a stamping operation that displaces, in a direction normal to the first face, portions of the substrate corresponding to the selected portions of the first surface relative to the portions of the substrate corresponding to the surrounding portions of the first surface.

9. The method of claim 7 wherein the forming the metallic substrate comprises forming the metallic substrate in an etching operation that removes material of the metallic substrate from the first surface.

10. The method of claim 6 wherein the forming comprises forming a plurality of contact pads on a second surface of the metallic substrate opposite the first surface, each in electrical contact with a respective one of the plurality of leads.

11. The method of claim 6, comprising, after the wirebonding and before the forming, depositing a layer of molding compound on the first surface of the metallic substrate, encapsulating the semiconductor die and the wirebond wires while leaving a second surface of the metallic substrate, opposite the first surface, exposed.

12. The method of claim 6 wherein removing the exposed side surfaces of the second conductive material comprises removing the exposed side surfaces of the second conductive material by a pressure wash process.

13. The method of claim 6 wherein removing the exposed side surfaces of the second conductive material of the cavities comprises removing the exposed side surfaces of the second conductive material of the cavities to form an outer surface of the lead.

\* \* \* \* \*